(12) United States Patent
Suzuki et al.

(10) Patent No.: US 6,351,885 B2
(45) Date of Patent: *Mar. 5, 2002

(54) METHOD OF MAKING CONDUCTIVE BUMP ON WIRING BOARD

(75) Inventors: Etsuji Suzuki, Kanagawa-ken; Akira Yonezawa, Tokyo; Toshio Okuno, Kanagawa-ken, all of (JP)

(73) Assignees: Yamaichi Electronics Co., Ltd., Tokyo; Shoshotech Co., Ltd., Kanagawa Ken, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/079,857

(22) Filed: May 15, 1998

(51) Int. Cl.[7] ................................................. H05K 3/02
(52) U.S. Cl. ............................. 29/847; 29/840; 29/846; 427/96
(58) Field of Search ............................. 174/250; 29/846, 29/847, 840, 825, 830; 427/96

(56) References Cited

U.S. PATENT DOCUMENTS

| 3,209,066 | A | * | 9/1965 | Toomey et al. ............. 174/262 |
| 5,207,887 | A | * | 5/1993 | Crumly et al. |
| 5,245,135 | A | * | 9/1993 | Schreiber et al. |
| 5,245,750 | A | * | 9/1993 | Crumly et al. ................ 29/840 |
| 5,354,205 | A |   | 10/1994 | Feigenbaum |
| 5,390,412 | A | * | 2/1995 | Gregoire et al. |
| 5,451,722 | A | * | 9/1995 | Gregoire |
| 5,790,377 | A | * | 8/1998 | Schreiber et al. ........... 361/704 |
| 5,831,832 | A | * | 11/1998 | Gillette et al. .............. 361/760 |
| 5,929,516 | A | * | 7/1999 | Heerman et al. ........... 257/701 |
| 6,085,414 | A | * | 7/2000 | Swarbrick et al. |
| 6,166,333 | A |   | 12/2000 | Crumly et al. |

* cited by examiner

*Primary Examiner*—Carl J. Arbes
(74) *Attorney, Agent, or Firm*—Wenderoth, Lind & Ponack, L.L.P.

(57) ABSTRACT

A wiring board structure has an insulating base having at least one projection located thereon, wherein the insulating base and the at least one projection are integrally formed from a same piece of insulating material. The wiring board structure also has at least one lead located on the insulating base, wherein a part of the at least one lead covers the at least one projection to form at least one conductive bump.

3 Claims, 8 Drawing Sheets

FIG. 9
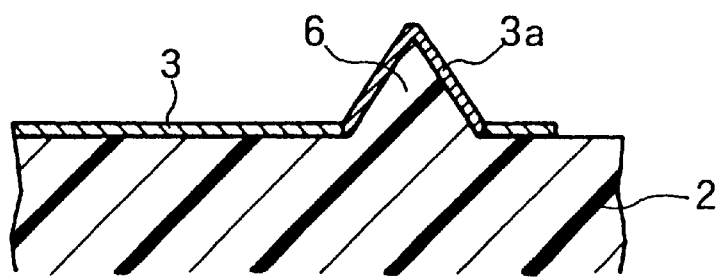
FIG. 10
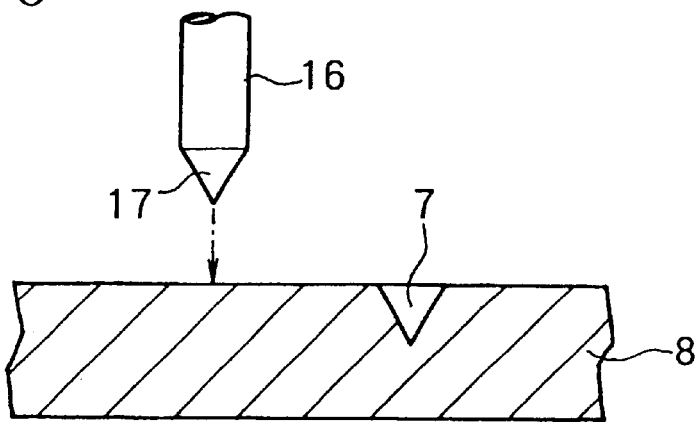
FIG.11A  FIG.11B  FIG.11C
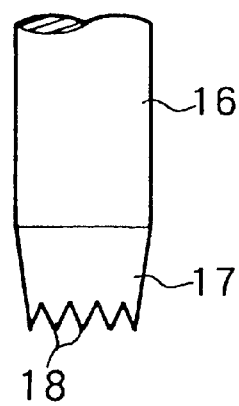 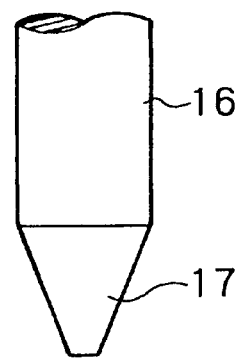 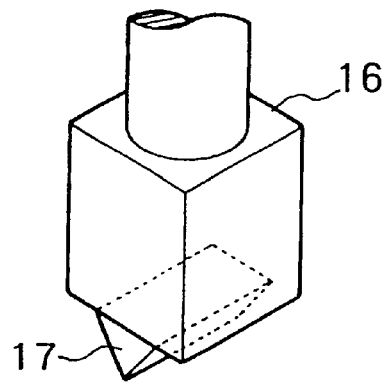

METHOD OF MAKING CONDUCTIVE BUMP ON WIRING BOARD

BACKGROUND OF THE INVENTION

This invention relates to a structure of a wiring board used for contacting or connecting with a given electronic part such as an IC or the like, and more particularly to a conductive bump in a wiring board to be subjected to the above contact or connection.

In this embodiment, the term "contact" refers to an electrical connection through a free contact surface which comes into and out of connection freely, and the term "connection" refers to an electrical connection disconnectably joined by solder or the like.

Conventionally, when a given electronic part such as an IC is loaded on a wiring board for electrical connection, a wiring pattern is formed on the surface of the wiring board and an unlike metal such as a conductive paste or the like is bulged to form a conductive bump on the surface of a lead forming this wiring pattern, so that a terminal of the electrical part is contacted with or connected to the conductive bump.

Also, for achieving an electrical connection between a wiring board and another wiring board, according to another conventional method, a conductive bump is formed on a lead forming the wiring pattern of one of the wiring boards and contacted with or connected to a terminal formed on an end of a lead of the other wiring board.

However, the above conventional method for forming the conductive bump on the conductive lead of the wiring board by raising an unlike metal such as a solder paste or the like, has problems, such that the method for forming the conductive bump is complicated, positional accuracy is difficult to obtain, configuration of the height of the conductive bumps is irregular, and so forth. Although this conventional technique can effectively cope with the requirement of a smaller pitch arrangement of terminals, actual practice of the conventional technique is jeopardized because of the above problems.

The present invention has been accomplished to overcome the above problems.

SUMMARY OF THE INVENTION

It is, therefore, a general object of the present invention to provide a structure of a conductive bump in a wiring board which is capable of properly solving the above problems and enhancing the actual practice thereof.

To achieve the above object, there is essentially provided a structure of a conductive bump in a wiring board having a wiring pattern on a surface of an insulating base, characterized in that a local portion of the insulating base is raised from the surface of the insulating base to form a projection and a surface of the projection is covered with a part of a lead forming the wiring pattern to form the conductive bump.

From another aspect of the present invention, there is also provided a structure of a conductive bump in a wiring board characterized in that a bump is formed by a part of a lead forming the wiring pattern and a cavity is formed in the bump.

A more complete description of the present invention and many of the attendant advantages thereof will be readily obtained as the same becomes better understood by reference to the following detailed description when considered in connection with the accompanying drawings.

BRIEF DESCRIPTION OF THE DRAWINGS

FIG. 9 is an enlarged sectional view of a bump portion, showing an example in which the conductive bump is made of a hard metal;

FIG. 10 is a sectional view showing a toll for forming conductive bump forming recesses in the transfer plate; and FIGS. 11A and 11B are side views showing other examples of tools for forming the conductive bump forming recesses in the transfer plate, and FIG. 11C is a perspective view showing still another example thereof.

DETAILED DESCRIPTION OF THE EMBODIMENT

Figure 1:
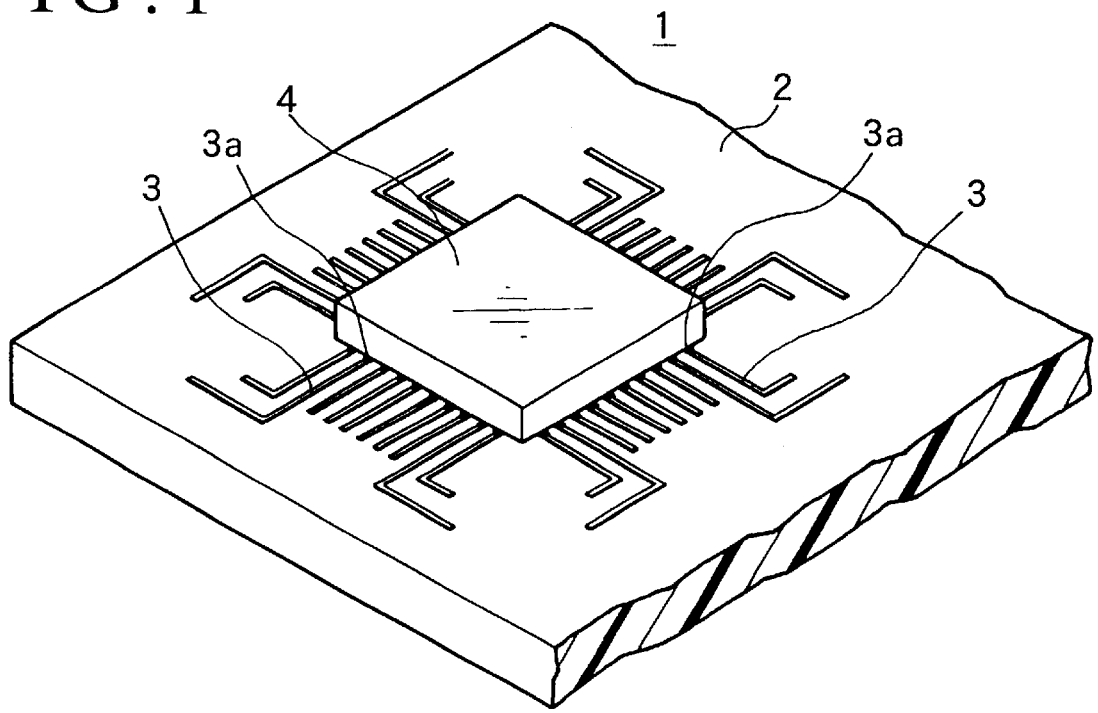
FIG. 1 is a perspective view of a wiring board according to the present invention with a given electronic part such as an IC loaded thereon.

As shown in FIG. 1, a wiring board 1 has a wiring pattern. This wiring pattern is formed by a lead 3 integrally attached to a surface of an insulating base 2 and extending in that condition. One end of the lead 3 is concentrated in a loading area of an IC 4 so the a conductive bump 3a is formed by the one end of the lead. The bump 3a, thus formed, is subjected to contact or connection with a pad (terminal) 5 intimately connected with the surface of the IC 4.

Figure 2A:
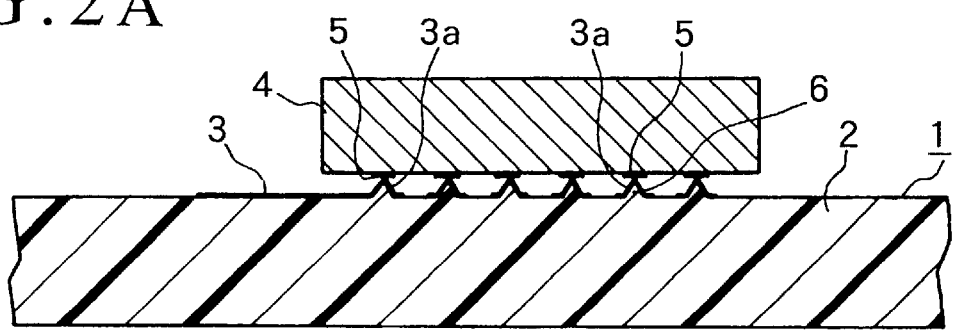
FIG. 2A is a sectional view of the wiring board of FIG. 1, showing a structure of a bump in which a conductive bump is backed up with an insulating projection.
Figure 3A:
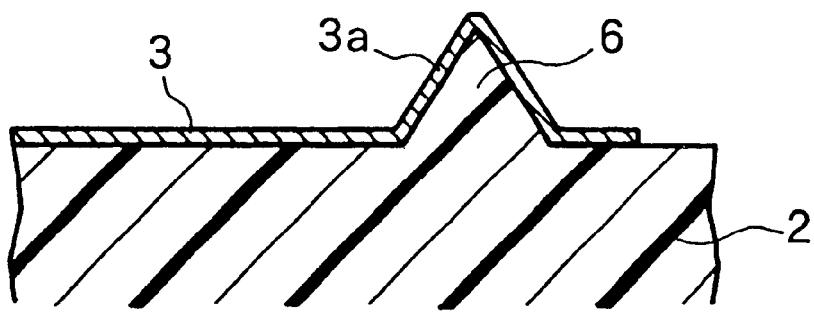
FIG. 3A is an enlarged sectional view of FIG. 2A
Figure 3B:
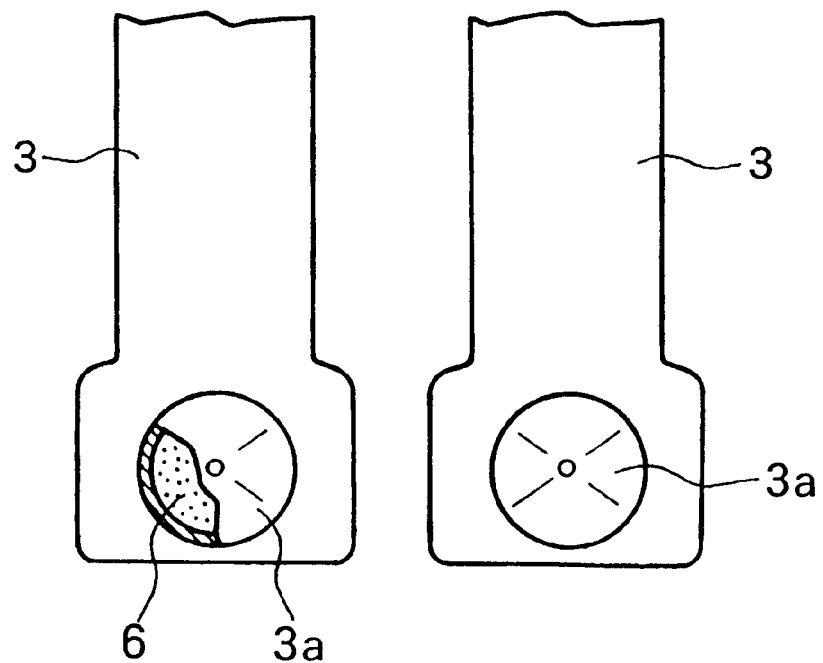
FIG. 3B is a plan view of FIG. 2A.

As means for forming the conductive bump 3a, as shown in FIGS. 2A, 3A and 3B, a local portion of the insulating base 2 is raised from the surface of the insulating base 2 to form an insulating projection 6. This projection 6 is covered with a part of the lead 3. That is, the lead 3 is wired in such a manner as to cover the projection 6, thereby forming the conductive bump 3a on an end portion of the lead 3.

This conductive bump 3a is a bump which utilizes a known technique for forming a lead on a surface of an insulating base. This bump 3a has a bump structure in which an internal cavity, which can be formed when a part of the lead 3 is given with a chevron-like configuration, is filled by the projection 6 formed by locally raising the insulating base 2.

The above conductive bump 3a can be realized, for example, by a lead forming method of FIGS. 4A–E.

Figure 4A:
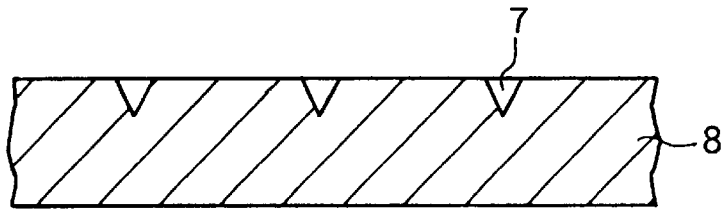
FIGS. 4A to 4E are sectional views showing a first example of a method of manufacturing a wiring board having the structure of the bump of FIG. 2A in the sequential order of processes.

As shown in FIG. 4A, a transfer plate 8 formed of a metal plate made of a material such as stainless steel and provided with a chevron-like bump forming recess 7 opening at the surface, is prepared.

Figure 4B:
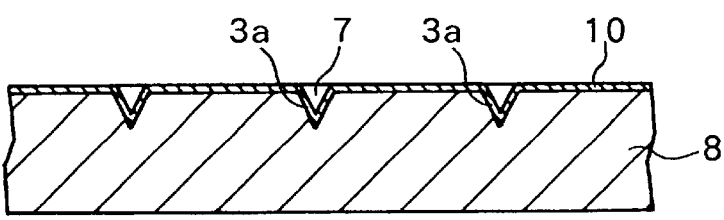

Then, as shown in FIG. 4B, a conductive film 10 is integrally overlain on the surface of the transfer plate 8. This conductive film 10 covers the entire surface of the transfer plate 8. However, where the bump forming recess 7 exists, the conductive film 10 intimately contacts with the bottom surface in the recess 7 and has a chevron-like configuration to thereby form the conductive bump 3a and further, to form the recess 7 inward of the conductive bump 3a.

Figure 4C:
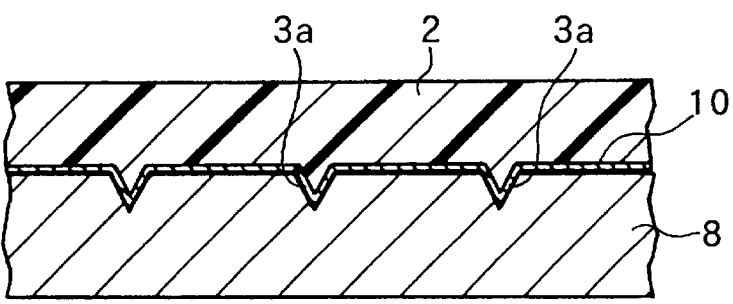

Then, as shown in FIG. 4C, an insulating layer is formed on the surface of the conductive film 10, thereby forming the insulating base 2 having a uniform thickness.

This insulating layer, i.e. the insulating layer 2, is partly filled in the recess 7 and raised locally to form the insulating projection 6 and further to form the conductive bump 3a which is integrally and intimately contacted with the surface of the projection 6 to cover it.

Figure 4D:
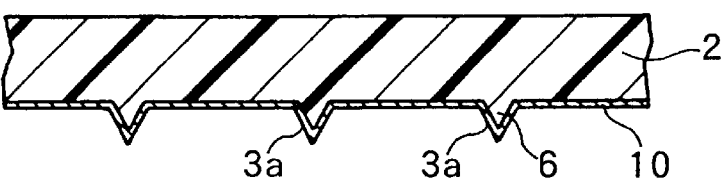
Figure 4E:
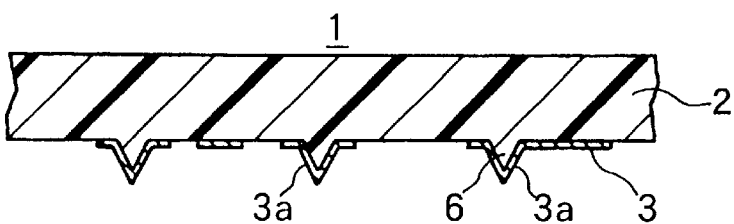

Then, as shown in FIG. 4D, the insulating base 2 is removed from the transfer plate 8. Then, as shown in FIG. 4E, the surface of the insulating base 2, thus removed, is subjected to an etching treatment so that the wiring pattern is formed. Thus, the bump 3a covering the projection 6 is formed by a part of the lead 3 forming the wiring pattern. In other words, the bump 3a covering the projection 6 as a part of the lead 3 is formed on an end portion of the lead 3 or at an intermediate part of the lead 3.

FIGS. 5A–E shown another method for forming the bump 3a of FIGS. 2A, 3A and 3B.

Figure 5A:
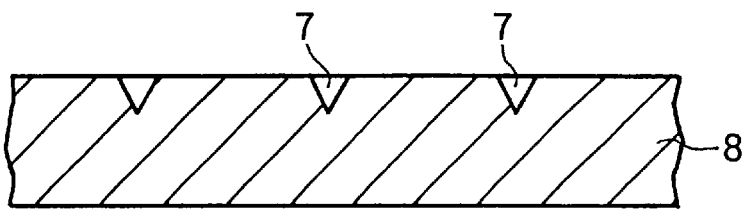
FIGS. 5A to 5E are sectional views showing a second example of a method of manufacturing a wiring board having the structure of the bump of FIG. 2A in sequential order.

As shown in FIG. 5A, the transfer sheet 8 made of a metal plate of a material such as stainless steel and provided with the chevron-like bump forming recesses 7 opening at the surface of the transfer sheet 8 is prepared.

Figure 5B:
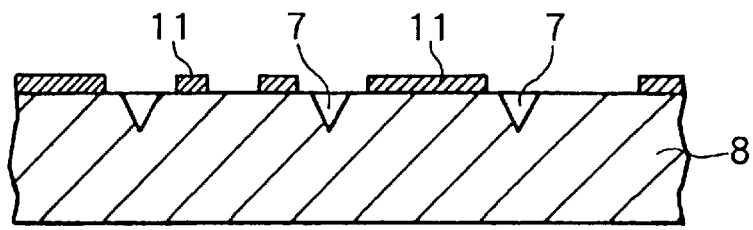

Then, as shown in FIG. 5B, a photoresist is applied to the surface of the transfer plate 8, or a photoresist is laminated on the surface of the transfer plate 8 and subjected to patterning treatment through exposure and development so that resist patterns 11 are formed.

Figure 5C:
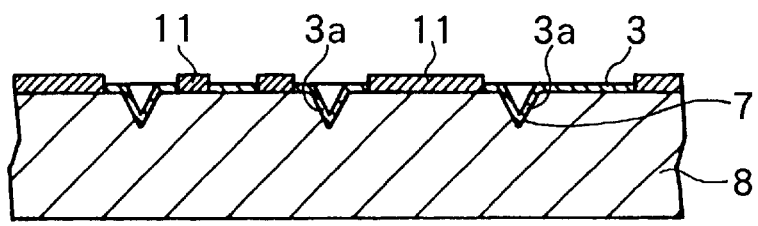

Then, as shown in FIG. 5C, the wiring pattern (lead 3) is grown on the surface of the transfer plate 8 between the resist patterns 11 through plating.

One end or an intermediate part of the lead 3, thus grown, is integrally contacted with the bottom surface in the recess 7 at an area where the bump forming recess 7 exists with the chevron-like configuration, thereby forming the conductive bump 3a and further forming the recess 7 in the inner surface of the conductive bump 3a.

Figure 5D:
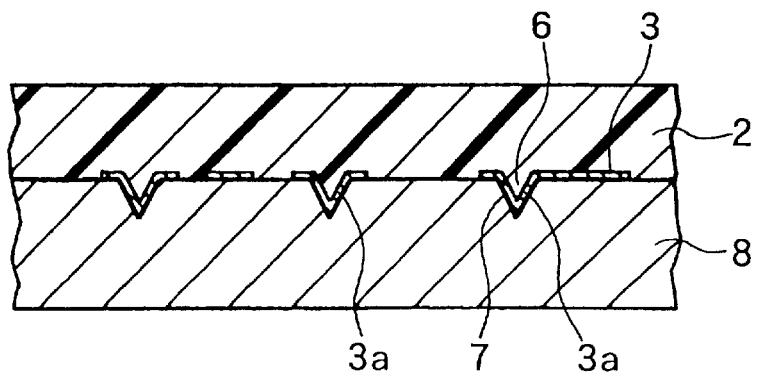

As shown in FIG. 5D, an insulating layer having a uniform thickness is formed in such a manner as to cover the surface of the wiring pattern. This insulating layer, i.e. the insulating base, 2 partly fills in the bump forming recesses 7 to raise a local portion of the insulating base 2 so that the insulating projections 6 are formed. By doing so, the conductive bumps 3a can be formed which are integrally and intimately contacted with the surface of the insulating projections 6 to cover the surface.

Figure 5E:
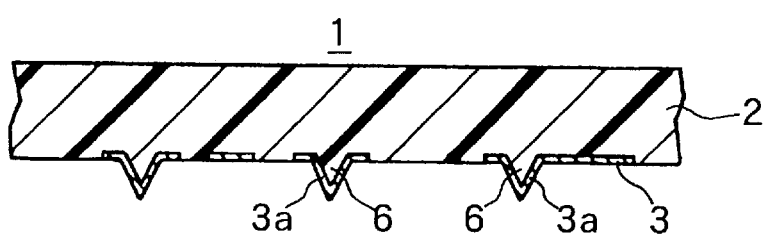

Then, as shown in FIG. 5E, the insulating base 2 is removed from the transfer plate 8 to obtain the wiring board 1 having the structure of conductive bumps of FIGS. 2A, 3A and 3B.

Figure 6A:
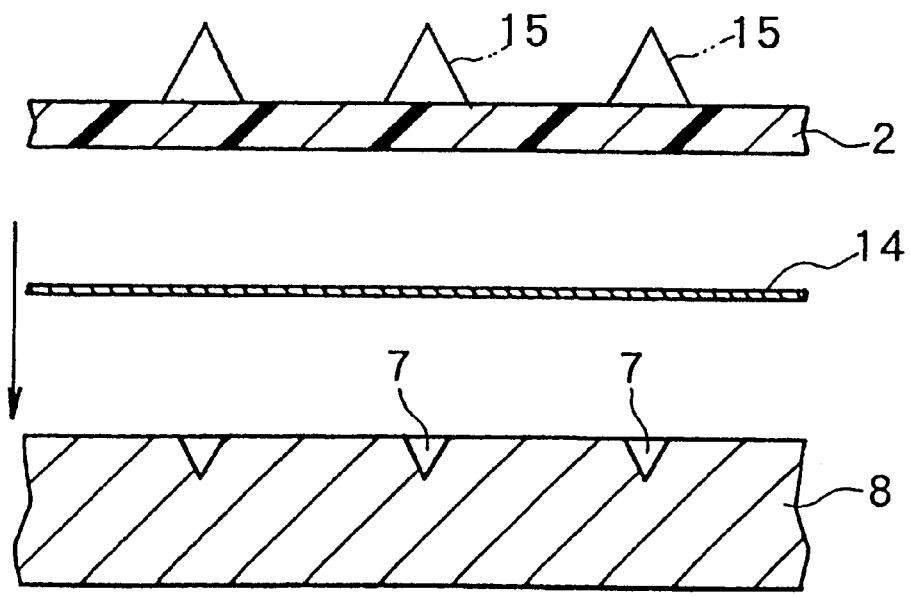
FIGS. 6A to 6B are sectional views showing a third example of a process of manufacturing a wiring board having the structure of the bump of FIG. 2A.

FIGS. 6A and B show a method of manufacturing a wiring board having a structure in which the conductive bumps 3a are backed up by the insulating projection 6.

Figure 6B:
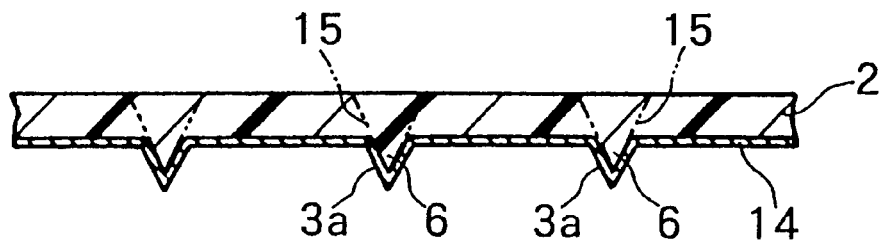

As shown in FIG. 6A, a transfer plate 8 made of metal having bump forming recesses 7, as in the above-mentioned example, is prepared. Then, the transfer plate 8, a conductive film 14 of a copper foil or the like, and an insulating base 2 are layered with the conductive film 14 disposed between the transfer plate 8 and the insulating base 2. The result is thermally welded together under pressure with use of a vacuum heat pressing machine or the like, to form an integral layered structure. At the same time, a part of the insulating base 2 and a part of the conductive film 14 are pushed together into the bump forming recesses 7, and the result is removed to obtain a board with bumps as shown in FIG. 6B.

By pushing local portions of the insulating base 2 and local portions of the conductive film 14 into the bump forming recesses 7, a chevron-like insulating projection 6 is formed in each recess 7. At the same time, a chevron-like conductive film 14 is formed in each recess 7 to form the conductive bumps 3a.

Then, as in the same manner as in FIG. 4E, the conductive film 14 is subjected to patterning treatment through a photo-etching process or the like, so that a wiring pattern is obtained.

In the embodiment of FIGS. 6A and B, as means for tightly and positively pushing the local portions of the insulating base 2 and the conductive film 14 into the bump forming recesses 7, as shown in FIG. 6A, the insulating bumps 15 are provided on the surface of the insulating base 2, i.e. the surface on the other side of the recesses 7. Then, by flatly compressing the insulating bumps 15 through thermal pressure welding, a part of the base is tightly filled into the recesses 7, so that insulating projections 6 can be formed.

In case the configuration of each conductive bump 3a is small and the pitch is very small as well, the bumps 15 may be made of comparatively harder insulating material than the base 2 and may be formed on the insulating base 2 by printing or the like, and then hot pressed. By doing so, the insulating base 2 and the conductive film 14 can more effectively be pushed into the recesses 7 and the conductive bumps 3a can be formed into a predetermined configuration, copying the inner surface of each conductive bump 3a.

As one preferred example, in a wiring board 1 having a structure of a bump in which the conductive bumps 3a are backed up with the insulating projections 6, a rubber material is used as the material of the insulating base 2. By doing so, a bump structure in which the conductive bumps 3a are backed up with the insulating projections 6 made of rubber material can be formed. In case the conductive bumps 3a are brought into contact with another wiring board or a given electronic part such as an IC or the like, as shown in FIG. 1, it becomes possible to apply an appropriate elastic force to the conductive bumps 3a to increase the contacting pressure.

In the wiring board 1 obtained by the methods illustrated in FIGS. 4A–E, 5A–E and 6A and B, local portions of the insulating base 2 are raised form the surface of the base 2 to form the projections 6. When the wiring patterns are to be formed, the surface of each projection 6 is covered with a part of the lead 3 to form the conductive bumps 3a.

In FIGS. 2A, 3A, 4, 5 and 6, another wiring pattern may be formed on the surface of the insulating base 2 on the other side of the wiring pattern. In this case, both wiring patterns can be electrically connected together through the insulating base 2.

Figure 2B:
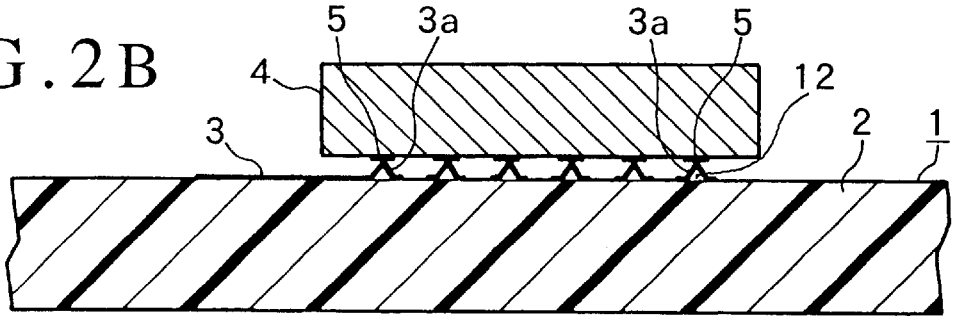
FIG. 2B is a sectional view of FIG. 1, showing a structure of a bump in which the conductive bump is backed up by a cavity.
Figure 7A:
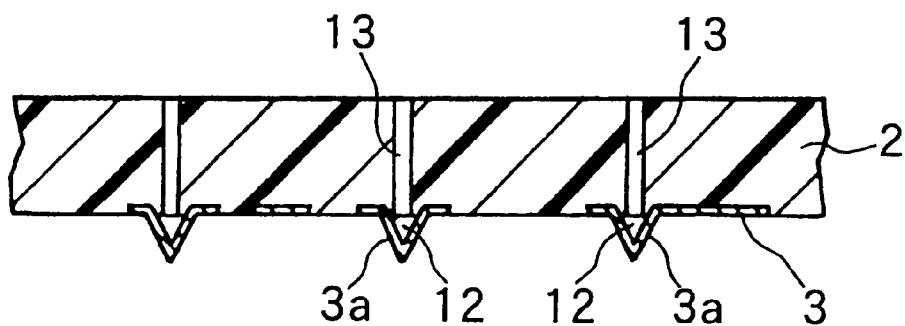
FIG. 7A is a sectional view of a wiring board showing a structure of a bump in which the conductive bump is of a hollow structure and backed up by a cavity and FIG. 7B is a plan view of FIG. 7A.
Figure 7B:
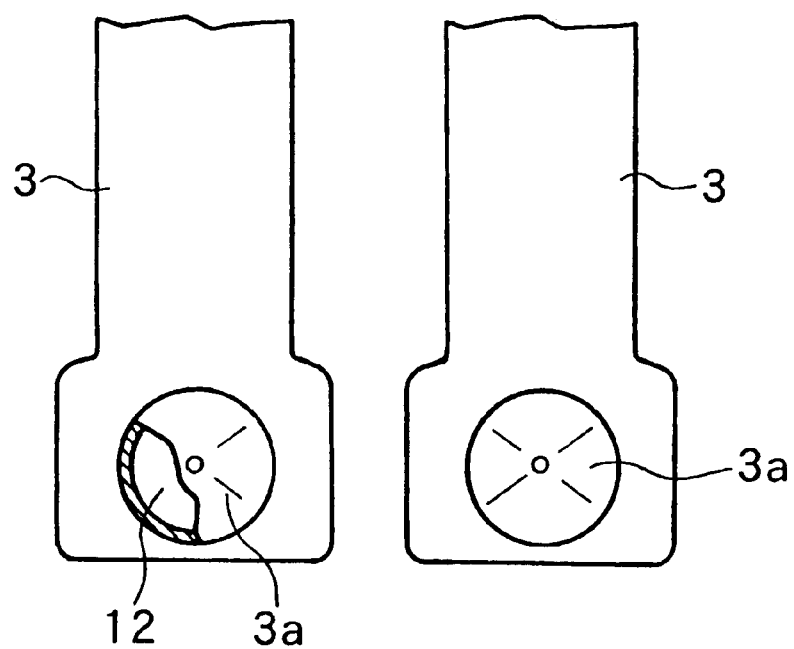

FIGS. 2B, 7A and 7B show a structure of a conductive bump in a wiring board, in which the wiring board 1 has a wiring pattern on the surface of the insulating base 2 and in such a wiring board 1, the bumps 3a are formed by a part of the lead 3 forming the wiring pattern and a cavity 12 is formed beneath the bumps 3a.

When the lead 3 is formed, a part of the lead 3 is locally applied with a chevron configuration and is intimately contacted with the insulating base 2. By doing so, the conductive bump 3a having the cavity 12 formed between the projection and the insulating base caused by the chevron-like projection can be obtained.

The conductive bump 3a is backed up by the cavity 12 and the cavity creates an elasticity to the conductive bump 3a. The foregoing arrangement serves as means for increasing the contacting pressure with respect to a terminal 5 of the electronic part such as the IC 4 or the like. In order to ensure the elastic contacting pressure by the cavity 12, an air hole 13 leading to the cavity 12 may be formed in the insulating base 2 in such a manner that the air hole 13 extends through the insulating base 2.

One example of a method of forming the conductive bump 3a backed up by the cavity 12 will now be described with reference to FIGS. 8A–E.

Figure 8A:
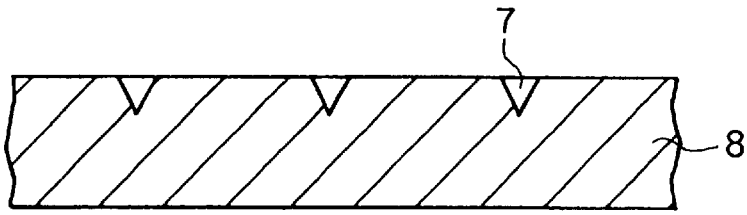
FIGS. 8A to 8E are sectional views showing one example of a method of manufacturing the wiring board of FIG. 7 in sequential order.

As shown in FIG. 8A, a transfer plate 8 made of a metal plate of a material such as stainless steel and provided with chevron-like bump forming recesses 7 opening at the surface of the transfer plate 8 is prepared.

Figure 8B:
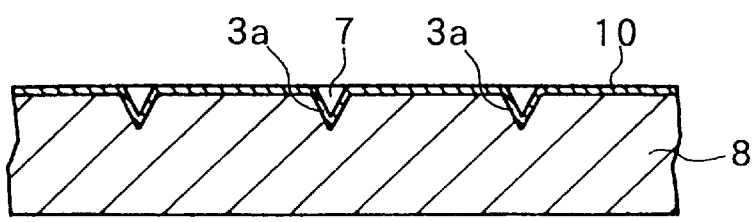

Then, as shown in FIG. 8B, the conductive film 10 is integrally overlain on the surface of the transfer plate 8. This conductive film 10 covers the entire surface of the transfer plate 8. However, where the bump forming recesses 7 exists, the conductive film 10 is intimately contacted with the bottom surface in the recesses 7 with a chevron-like configuration thereby forming the conductive bumps 3a and further forming the recesses 7 inward of the conductive bumps 3a.

Figure 8C:
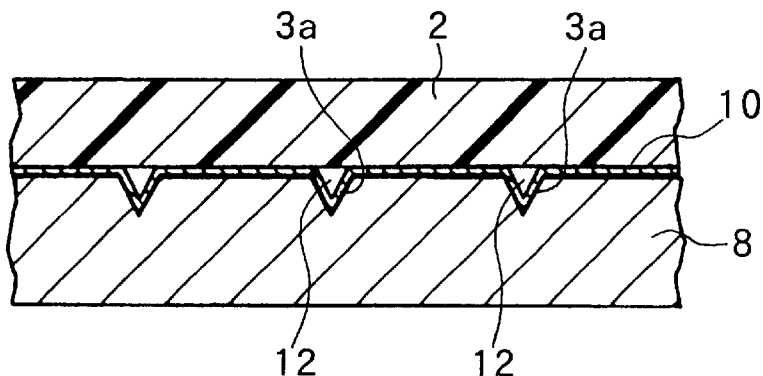

Then, as shown in FIG. 8C, an insulating base 2 is integrally overlain on the surface of the conductive surface 8. By doing so, the recesses 7 are tightly closed to form the cavities 12.

Figure 8D:
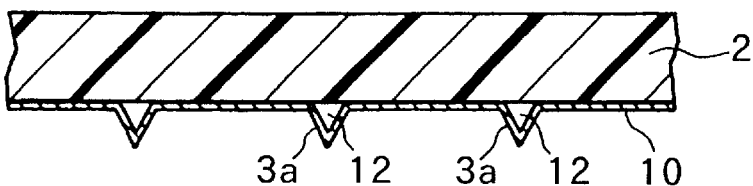
Figure 8E:
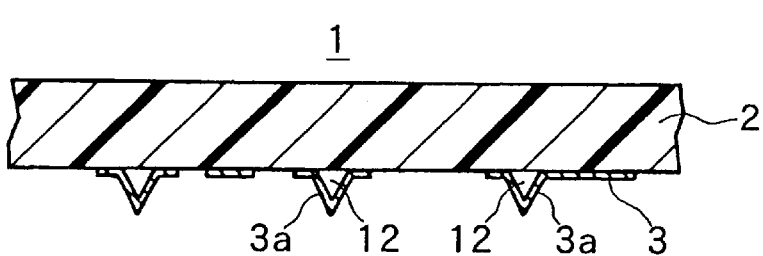

Then, as shown in FIG. 8D, the insulating base 2 is removed from the transfer plate 8. Then, as shown in FIG. 8E, the surface of the insulating base 2, thus removed, is subjected to etching treatment so that the wiring pattern is formed. Thus, the bumps 3a backed up by the cavities 12 are formed on a part of the lead 3 forming the wiring pattern, for example, on an end portion of the lead 3 or at an intermediate part of the lead 3.

A method of forming the bump forming recesses 7 in the transfer plate 8 of FIGS. 4, 5, 6 and 8 will now be described with reference to FIGS. 10 and 11. The conductive bumps 3a are often as small as 10 to 50 μm in height and 10 to 100 μm in the bottom side length and arranged at pitches as small as 30 to 200 μm. The bump for the test use desirably has a generally conical configuration and is required to be of uniform precision in configuration and pitch.

In a method of forming such recesses 7 in the transfer plate 8, as shown in FIGS. 10, 11A and 11B, a tool 16 having a conical or generally conical tip 17 and being made of ultra hard metal is vertically hammered into the surface of the transfer plate 8 to give hammering traces thereon. These hammering traces each have a conical or a generally conical configuration depending on the configuration of the tool tip 17 and form the bump forming recesses 7.

FIG. 10 shows an example in which the tool tip 17 has a conical configuration and recesses having the same configuration are formed on the surface of the transfer plate 8.

In FIGS. 11A and 11B, the tool tip 17 has a conical configuration with a cutting head. In FIG. 11B, the top surface of the cutting head is flat, and in FIG. 11A, the top surface of the cutting head is formed with a plurality of teeth 18 each having a sharpened tip portion. In the example of FIG. 11C, the recesses 7 each having a trigonal prism like configuration and are formed with use of a tool 16 having a tool tip 17 of the same configuration as the recesses 7. Accordingly, the conductive bumps 3a formed by the recesses 7 exhibit a trigonal prism like configuration. The sharpened ridge lines of the conductive bumps 3a are subjected to contact with or connected to terminals of an electronic part such as the IC 4 or the like.

In any of the bump structures in which the conductive bumps 3a are backed by the projections 6 as shown in FIGS. 3A and B and of the bump structure in which the conductive bumps 3a are backed up by the cavities 12 as shown in FIGS. 7A and B, only the conductive bumps 3a may be made of harder metal than other lead 3 portion, such as Ni, Cr or the like, as shown in FIG. 9.

As a method of forming the conductive bumps 3a, prior to formation of the conductive film 10, 14 or prior to plating of the leads 3 of FIGS. 4B, 5C, 6A and 8B, the conductive bumps 3a made of hard metal, are formed on the inner surfaces of the recesses 7 and then, the soft conductive film 10, 14 made of copper, a copper alloy or the like, is overlain or the leads 3 are formed by growth plating. In this case, as shown in FIG. 9, the leads made of copper or copper alloy, are partly (conductive bumps 3a) formed of a hard metal, as shown in FIG. 9. The leads 3 are partly applied with a chevron-like configuration by the recesses 7 to form the conductive bumps 3a and the conductive bumps 3a are covered with a harder conductive metal than the leads 3, so that a composite structure is obtained. These alternatives can be realized by the embodiments of the manufacturing methods of FIGS. 4, 5, 6 and 8.

The above-mentioned wiring board may include a case where a plurality of leads 3 are arranged in array on the surface of the insulating base 2 and the conductive bumps 3a having any one of the above-mentioned bump structures are provided on end portions of the leads 3 and thereafter, the conductive bumps 3a are brought into contact, under pressure, with terminals (electronic pads) of a given electronic part such as a liquid crystal display unit or the like.

According to the present invention, when a wiring pattern is formed on a wiring board, a conductive bump can be formed by a part of the conductive lead forming the wiring pattern and the conductive bumps can be formed at small pitches utilizing the technique for forming the wiring patterns at small pitches.

Furthermore, when the wiring pattern is formed through application of the known technique for forming the wiring pattern, merely by employing an additional means for providing the bump forming recesses in a local area of the pattern forming surface, uniform conductive bumps can be formed at equal pitches with precision.

Obviously, numerous modifications and variations of the present invention are possible in light of the above teachings. It is therefore to be understood that within the scope of the appended claims, the present invention may be practiced otherwise than as specifically described herein.

What is claimed is:

1. A method for making at least one conductive bump on a wiring board, said method comprising:

overlaying a conductive film on a surface of a transfer plate having at least one chevron-like recess, such that the conductive film assumes the shape of the surface of the transfer plate, including the at least one chevron-like recesses, to form at least one conductive bump;

forming an insulating layer on a surface of the conductive film opposite to a surface of the conductive film in contact with the transfer plate, such that the insulating layer fills in the at least one chevron-like recess in the conductive film and the insulating layer has a flat surface opposite to a surface of the insulating layer adjacent to the conductive film;

removing the conductive film and insulating layer from the transfer plate; and etching the conductive film to form a wiring pattern.

2. A method according to claim 1, wherein said etching of the wiring pattern in the conductive film occurs after said removing of the conductive film and insulating layer from the trnsfer plate.

3. A method according to claim 1, wherein said etching of the wiring pattern in the conductive film occurs after said forming of the insulating layer on the surface of the conductive.

* * * * *